(12) United States Patent
Chen et al.

(10) Patent No.: US 9,520,296 B2
(45) Date of Patent: Dec. 13, 2016

(54) SEMICONDUCTOR DEVICE HAVING A LOW DIVOT OF ALIGNMENT BETWEEN A SUBSTRATE AND AN ISOLATION THEREOF AND METHOD OF FORMING THE SAME

(71) Applicant: Taiwan Semiconductor Manufacturing Company Limited, Hsinchu (TW)

(72) Inventors: De-Fang Chen, Hsinchu (TW); Teng-Chun Tsai, Hsinchu (TW); Cheng-Tung Lin, Hsinchu County (TW); Li-Ting Wang, Hsinchu (TW); Chih-Tang Peng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/302,568

(22) Filed: Jun. 12, 2014

(65) Prior Publication Data

US 2015/0364333 A1    Dec. 17, 2015

(51) Int. Cl.
*H01L 21/308* (2006.01)
*H01L 29/06* (2006.01)
(Continued)

(52) U.S. Cl.
CPC ..... *H01L 21/3085* (2013.01); *H01L 21/76224* (2013.01); *H01L 29/0653* (2013.01); *H01L 29/66666* (2013.01); *H01L 29/7827* (2013.01)

(58) Field of Classification Search
CPC .. H01L 29/165; H01L 29/66636; H01L 29/78; H01L 29/7843; H01L 29/66545; H01L 21/823842; H01L 21/823814; H01L 21/823864; H01L 21/823443; H01L 21/823807; H01L 21/3085; H01L 29/66666; H01L 21/76224; H01L 29/0653; H01L 29/7827
(Continued)

(56) References Cited

U.S. PATENT DOCUMENTS

2008/0209118 A1* 8/2008 Kajiyama ............... G11C 11/16
                                                              711/105
2008/0237733 A1* 10/2008 Chen ............... H01L 21/823807
                                                              257/374
(Continued)

FOREIGN PATENT DOCUMENTS

KR   1019970072117      11/1997
KR   1020040045235       6/2004
KR    100596889          7/2006

OTHER PUBLICATIONS

Korean Office Action; Application No. 10-2014-0150172; dated Sep. 25, 2015.
(Continued)

*Primary Examiner* — Thomas L Dickey
*Assistant Examiner* — Changhyun Yi
(74) *Attorney, Agent, or Firm* — Jones Day

(57) ABSTRACT

According to an exemplary embodiment, a method of forming vertical structures is provided. The method includes the following operations: providing a substrate; forming a first oxide layer over the substrate; forming a first dummy layer over the first oxide layer; etching the first oxide layer and the first dummy layer to form a recess; forming a second dummy layer in the recess (and further performing CMP on the second dummy layer and stop on the first dummy layer); removing the first dummy layer; removing the first oxide layer; and etching the substrate to form the vertical structure. According to an exemplary embodiment, a semiconductor device is provided. The semiconductor device includes: a substrate; an STI embedded in the substrate; and a vertical transistor having a source substantially aligned with the STI.

17 Claims, 18 Drawing Sheets

(51) Int. Cl.
  *H01L 21/762*    (2006.01)
  *H01L 29/78*     (2006.01)
  *H01L 29/66*     (2006.01)

(58) Field of Classification Search
  USPC .......... 257/369, E21.632, E27.062; 438/231
  See application file for complete search history.

(56) References Cited

U.S. PATENT DOCUMENTS

2010/0308403 A1*  12/2010  Jang .................. H01L 27/10876
                                                    257/334
2011/0018056 A1    1/2011  Takeuchi
2012/0241868 A1*   9/2012  Tsai et al. ..................... 257/369

OTHER PUBLICATIONS

Korean Notice of allowance; Application No. 10-2014-0150172; dated May 13, 2016.
Taiwan Patent Office, Office Action issued Jun. 1, 2016, in Application No. 104119036.

\* cited by examiner

SEMICONDUCTOR DEVICE HAVING A LOW DIVOT OF ALIGNMENT BETWEEN A SUBSTRATE AND AN ISOLATION THEREOF AND METHOD OF FORMING THE SAME

BACKGROUND

Vertical semiconductor devices, such as vertical gate-all-around transistors, are very popular but produce unexpected device characteristics. Therefore, there is a need to improve the manufacture thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
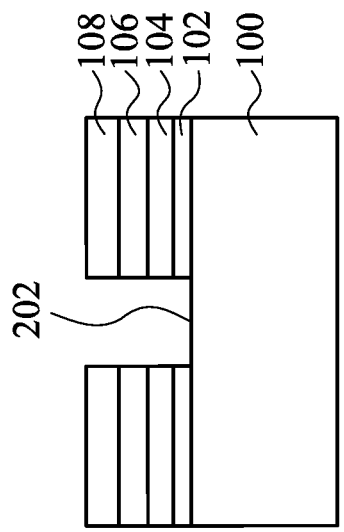
FIG. 2 is a sectional view illustrating the exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method of forming a vertical structure. The method may be further integrated with shallow trench isolation formation and N/P well implant processes. In order to form the vertical structure, the method utilizes a reversed patterning process which etches a first dummy layer to form a recess therein, then fills a second dummy layer in the recess as a hard mask, and combines other steps to produce the vertical structure.

In the embodiment, because an upper portion of the vertical structure is protected by the hard mask, it is easier to perform other processes without damaging it. In the embodiment, the hard mask may have less loss due to less usage of chemical mechanical polishing compared to prior methods. In the embodiment, the method incorporated with formation of an STI provides substantial alignment between a drain of the vertical structure and the STI to enhance process control on a gate length of the vertical structure.

Moreover, the vertical structures may refer to vertical gate all around (VGAA) transistors made of materials, for example: Si, SiGe, Ge, or III-V (InP, GaAs, AlAs, InAs, InAlAs, InGaAs, InSb, GaSb, InGaSb). Additionally, the vertical structures may be resized by using, for example, hard mask trimming and in-situ steam generation (ISSG).

Figure 1:
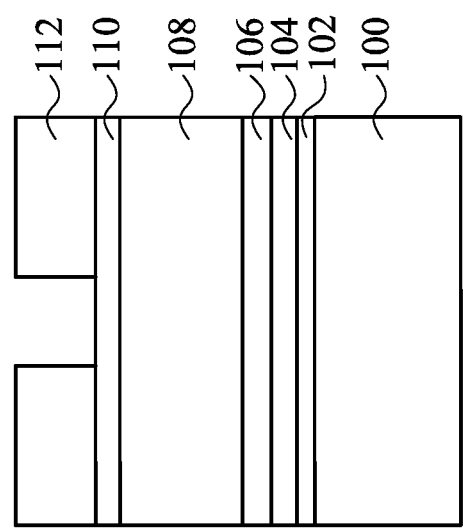
FIG. 1 is a sectional view illustrating an exemplary semiconductor device in accordance with some embodiments.

FIG. 1 is a sectional view illustrating an exemplary semiconductor device in accordance with some embodiments. As shown in FIG. 1, a substrate 100 is provided. A first oxide layer 102, a CMP stop layer 104, a second oxide layer 106, and a planarization layer 108 are formed over the substrate 100. A silicon anti-reflection coating layer 110 and a photoresist layer 112 are used for an etching process. The CMP stop layer 104 may be made of SiN. The second oxide layer 106 may be formed by a PECVD process. The material of the substrate 100 may include, for example: Si, SiGe, Ge, or III-V (InP, GaAs, AlAs, InAs, InAlAs, InGaAs, InSb, GaSb, InGaSb).

In the embodiment, the substrate may include several layers for formation of a source, a channel, and a drain. In some embodiments, the source, the channel, and the drain of the vertical structure may be formed after the method.

FIG. 2 is a sectional view illustrating the exemplary semiconductor device in accordance with some embodiments. As shown in FIG. 2, the first oxide layer 102, the CMP stop layer 104, the second oxide layer 106, and the planarization layer 108 are etched, for example, by using plasma etching to expose a portion 202 of the substrate 100. Plasma etching refers to the removal of material, typically a masked pattern of semiconductor material, by exposing the material to a bombardment of ions (usually plasma of reactive gases such as fluorocarbons, oxygen, chlorine, boron trichloride; sometimes with addition of nitrogen, argon, helium and other gases) that dislodge portions of the material from the exposed surface.

Figure 3:
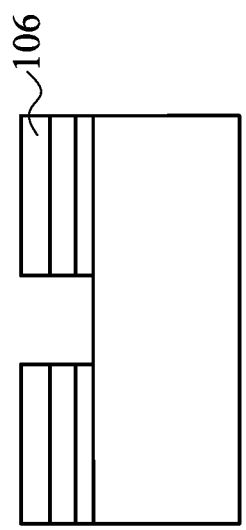
FIG. 3 is a sectional view illustrating the exemplary semiconductor device in accordance with some embodiments.

FIG. 3 is a sectional view illustrating the exemplary semiconductor device in accordance with some embodiments. As shown in FIG. 3, the planarization layer 108 is removed, for example, by using plasma etching, to expose the second oxide layer 106 as a temporary hard mask.

Figure 4:
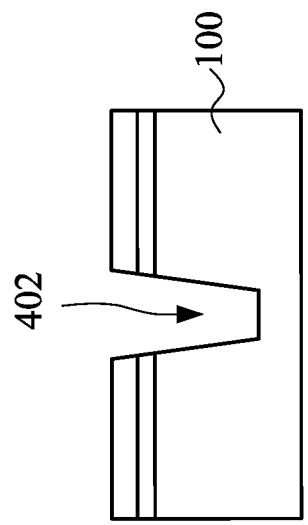
FIG. 4 is a sectional view illustrating the exemplary semiconductor device in accordance with some embodiments.

FIG. 4 is a sectional view illustrating the exemplary semiconductor device in accordance with some embodiments. As shown in FIG. 4, the second oxide layer 106 is consumed during trench etching, and the exposed portion of the substrate 100 is etched to form a trench 402, for example, by using plasma etching.

Figure 5:
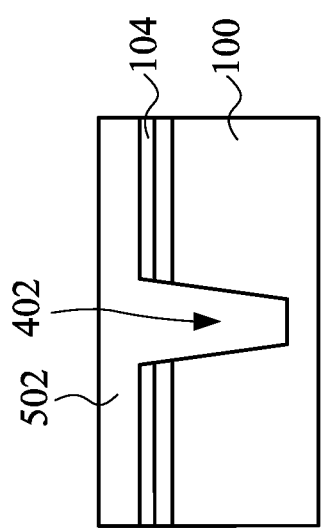
FIG. 5 is a sectional view illustrating the exemplary semiconductor device in accordance with some embodiments.

FIG. 5 is a sectional view illustrating the exemplary semiconductor device in accordance with some embodiments. As shown in FIG. 5, a third oxide layer 502 is formed over the CMP stop layer 104 and in the trench 402 by CVD deposition and annealing.

Figure 6:
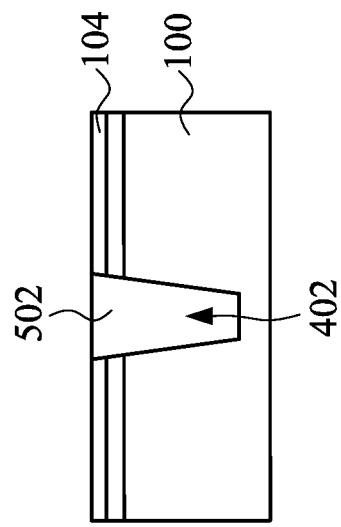
FIG. 6 is a sectional view illustrating the exemplary semiconductor device in accordance with some embodiments.

FIG. 6 is a sectional view illustrating the exemplary semiconductor device in accordance with some embodiments. As shown in FIG. 6, a CMP process is performed on the third oxide layer 502 and stops at about the CMP stop layer 104.

Figure 7:
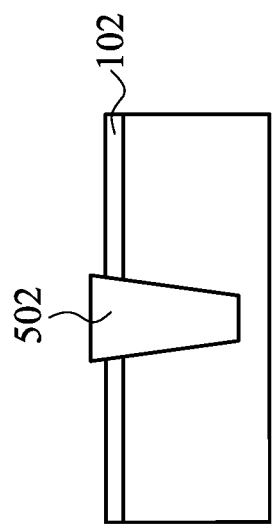
FIG. 7 is a sectional view illustrating the exemplary semiconductor device in accordance with some embodiments.

FIG. 7 is a sectional view illustrating the exemplary semiconductor device in accordance with some embodiments. As shown in FIG. 7, the CMP stop layer 104 is removed, for example, by using wet etching, to expose the third oxide layer 502 and the first oxide layer 102.

Figure 8:
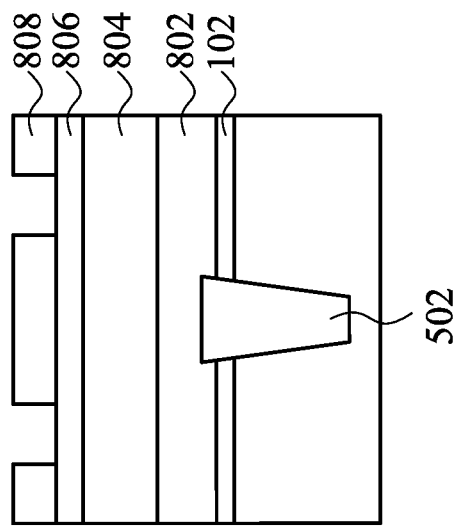
FIG. 8 is a sectional view illustrating the exemplary semiconductor device in accordance with some embodiments.

FIG. 8 is a sectional view illustrating an exemplary semiconductor device in accordance with some embodiments. As shown in FIG. 8, a first dummy layer 802 is formed over the first oxide layer 102 and the shallow trench isolation 502. Then, another planarization layer 804 is also formed over the first dummy layer 802. Another silicon anti-reflection coating layer 806 and another photoresist layer 808 are used for an etching process. The first dummy layer 802 may be made of, for example: a dielectric material, such as silicon oxide or silicon nitride; and conductive material, such as amorphous silicon or poly.

Figure 9:
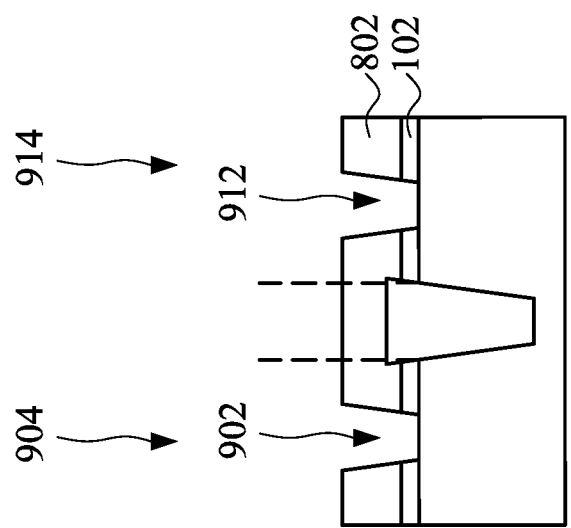
FIG. 9 is a sectional view illustrating the exemplary semiconductor device in accordance with some embodiments.

FIG. 9 is a sectional view illustrating an exemplary semiconductor device in accordance with some embodiments. As shown in FIG. 9, the first oxide layer 102, the first dummy layer 802, the planarization layer 804, the silicon anti-reflection coating layer 806, and the photoresist layer 808 are etched, and the planarization layer 804, the silicon anti-reflection coating layer 806 and the photoresist layer 808 are further removed, for example, by using plasma etching and wet etching. A first recess 902 in a first region 904 and a second recess 912 in a second region 914 are formed.

Figure 10:
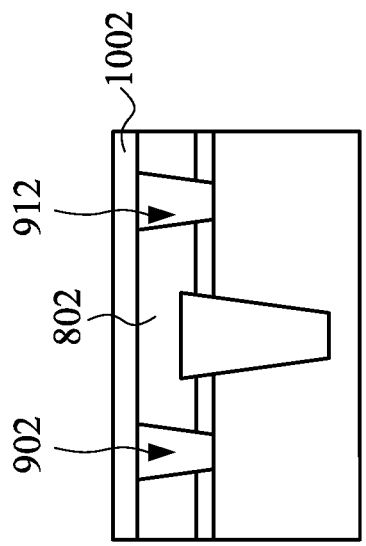
FIG. 10 is a sectional view illustrating the exemplary semiconductor device in accordance with some embodiments.

FIG. 10 is a sectional view illustrating the exemplary semiconductor device in accordance with some embodiments. As shown in FIG. 10, a second dummy layer 1002 is formed over the first dummy layer 802 and in the first recess 902 and the second recess 912 by a deposition process. The second dummy layer 1002 may be made of SiOCN. The second dummy layer 1002 has high etch selectivity toward the first dummy layer 802.

Figure 11:
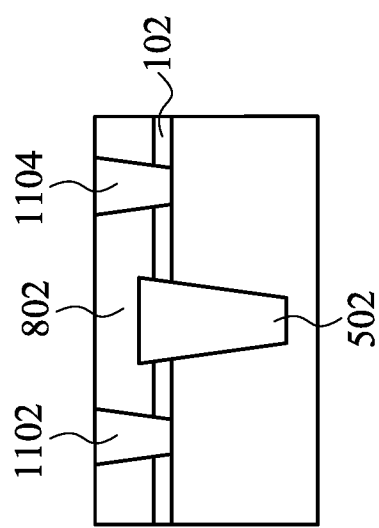
FIG. 11 is a sectional view illustrating the exemplary semiconductor device in accordance with some embodiments.

FIG. 11 is a sectional view illustrating the exemplary semiconductor device in accordance with some embodiments. As shown in FIGS. 10 and 11, a CMP process is performed on the second dummy layer 1002 and stops at the first dummy layer 802. A first hard mask 1102 and a second hard mask 1104 are formed by the second dummy layer 1002 in the first recess 902 and in the second recess 912.

Figure 12:
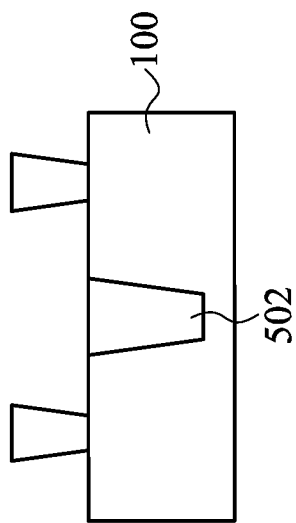
FIG. 12 is a sectional view illustrating the exemplary semiconductor device in accordance with some embodiments.

FIG. 12 is a sectional view illustrating the exemplary semiconductor device in accordance with some embodiments. As shown in FIGS. 11 and 12, the first dummy layer 802 is removed by using plasma etching or wet etching.

Then, the first oxide layer 102 is removed to expose the substrate 100, and the shallow trench isolation 502 is etched to align with the substrate 100.

Figure 13:
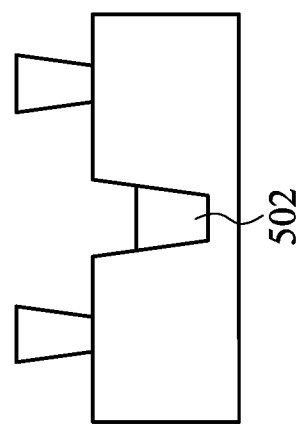
FIG. 13 is a sectional view illustrating the exemplary semiconductor device in accordance with some embodiments.

FIG. 13 is a sectional view illustrating the exemplary semiconductor device in accordance with some embodiments. As shown in FIG. 13, a portion of the shallow trench isolation 502 is etched back by using plasma etching or wet etching.

Figure 14:
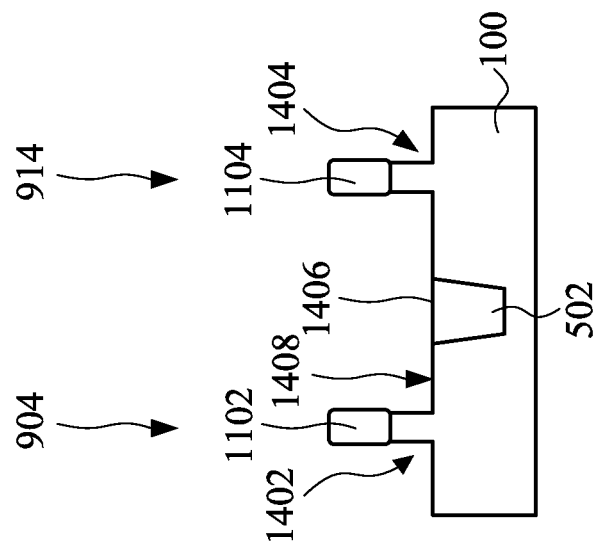
FIG. 14 is a sectional view illustrating the exemplary semiconductor device in accordance with some embodiments.

FIG. 14 is a sectional view illustrating the exemplary semiconductor device in accordance with some embodiments. As shown in FIG. 14, the first hard mask 1102 and the second hard mask 1104 are trimmed. The substrate 100 is etched back to make the substrate 100 substantially aligned with a top 1406 of the shallow trench isolation 502 and to form a first vertical structure 1402 in the first region 904 and a second vertical structure 1404 in the second region 914.

In the embodiment, at this step, the vertical structures 1402, 1404 may not yet include a source, a channel, and a drain which may be formed thereafter. The method incorporated with formation of the STI 502 provides substantial alignment (or a divot which would be merely a tiny step height between the surface 1408 of the substrate 100 and the top 1406 of the shallow trench isolation 502), so as to enhance process control on a gate length of the vertical structures 1402 in latter processes. In some embodiments, the divot is lower than about 20-100 angstroms.

In some embodiments, the vertical structures 1402, 1404 may already include a source, a channel and a drain, wherein the surface 1408 is included in the source (not shown). The method incorporated with formation of the STI 502 provides substantial alignment (or a divot which would be merely a tiny step height between the surface 1408 of the source of the vertical structure 1402 and the top 1406 of the shallow trench isolation 502), so as to enhance process control on a gate length of the vertical structures 1402 in latter processes. In some embodiments, the divot is lower than 20-100 angstroms.

Figure 14B:
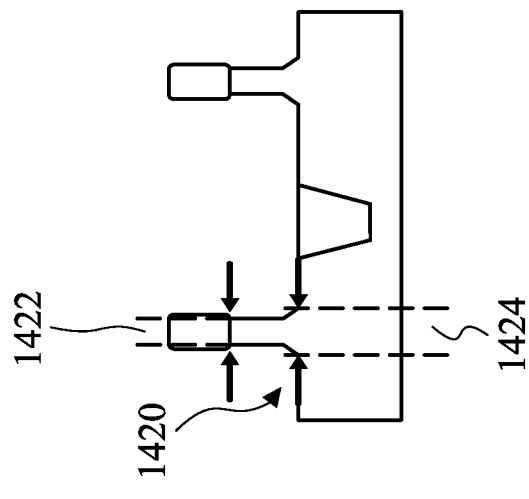
FIG. 14*b* is another sectional view illustrating the exemplary semiconductor device in accordance with some embodiments.
Figure 14A:
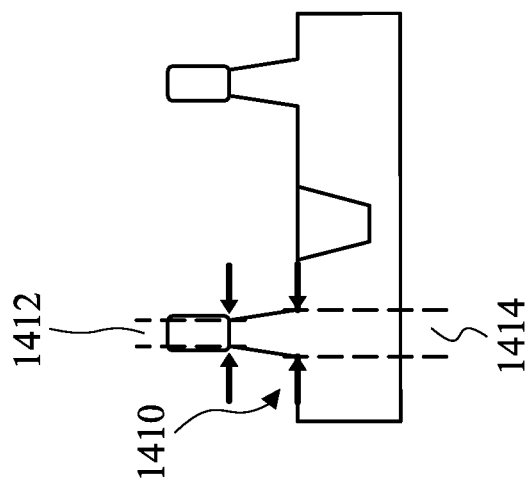
FIG. 14*a* is another sectional view illustrating the exemplary semiconductor device in accordance with some embodiments.

FIGS. 14a-14b are sectional views illustrating the exemplary semiconductor device in accordance with some embodiments. As shown in FIGS. 14a and 14b, compared to FIG. 14, a vertical structure 1410 has a tapered profile from its protrusion, and a vertical structure 1420 has a footing profile from its protrusion, while the vertical structure 1402 has a straight profile from its protrusion. A ratio of upper widths 1412, 1422 over bottom widths 1414, 1424 may be about 0.5-0.8.

Figure 15:
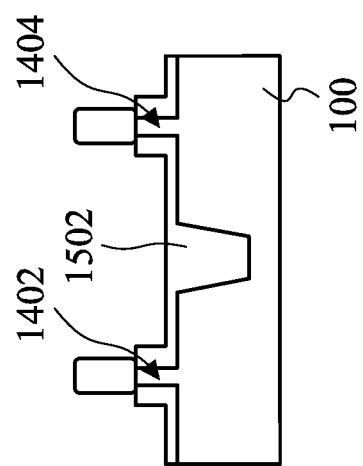
FIG. 15 is a sectional view illustrating the exemplary semiconductor device in accordance with some embodiments.

FIG. 15 is a sectional view illustrating the exemplary semiconductor device in accordance with some embodiments. Continuing from FIG. 14, as shown in FIG. 15, $H_2$ anneal forms a smooth surface on the substrate 100, the first vertical structure 1402, and the second vertical structure 1404. Moreover, an in-situ steam generation (ISSG) process trims the size of the first vertical structure 1402 and the second vertical structure 1404. Additionally, a high temperature (400° C.-800° C.) anneal lasting 5-60 minutes is used for STI enhancement. As such, an oxide layer 1502 grows and substantially covers the substrate 100, the first vertical structure 1402, and the second vertical structure 1404.

Figure 16:
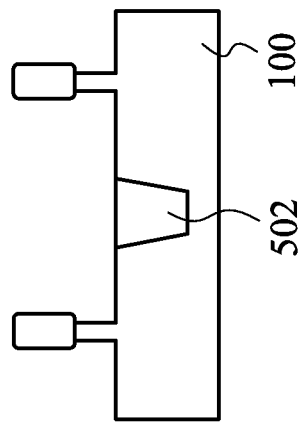
FIG. 16 is a sectional view illustrating the exemplary semiconductor device in accordance with some embodiments.

FIG. 16 is a sectional view illustrating the exemplary semiconductor device in accordance with some embodiments. As shown in FIGS. 15 and 16, the oxide layer 1502 is etched again to expose the substrate 100 and the shallow trench isolation 502.

Figure 17:
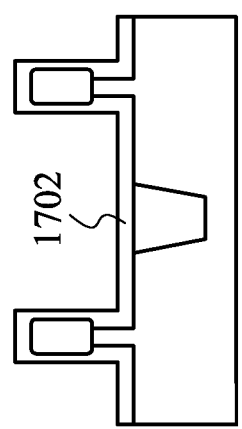
FIG. 17 is a sectional view illustrating the exemplary semiconductor device in accordance with some embodiments.

FIG. 17 is a sectional view illustrating the exemplary semiconductor device in accordance with some embodiments. As shown in FIG. 17, another oxide layer 1702 is deposited again as a screening oxide (e.g., SiO2). A person of ordinary skill in the art upon reading this disclosure would readily appreciate that the use of the oxide layer 1702 as a screening oxide for the ion implantation for latter phases.

Figure 18:
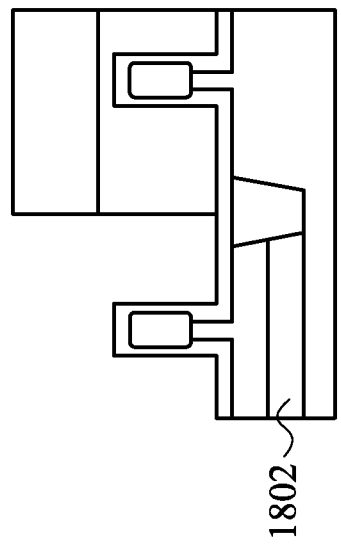
FIG. 18 is a sectional view illustrating the exemplary semiconductor device in accordance with some embodiments.

FIG. 18 is a sectional view illustrating the exemplary semiconductor device in accordance with some embodiments. As shown in FIG. 18, by using photoresist and anneal, a p-well 1802 for NMOS is formed.

Figure 19:
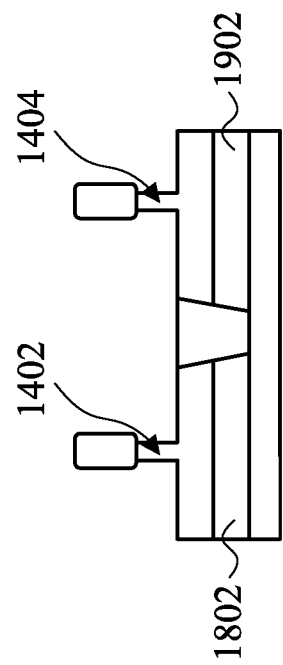
FIG. 19 is a sectional view illustrating the exemplary semiconductor device in accordance with some embodiments.

FIG. 19 is a sectional view illustrating the exemplary semiconductor device in accordance with some embodiments. As shown in FIG. 19, by using photoresist and anneal, an n-well 1902 for PMOS is formed.

Figure 20:
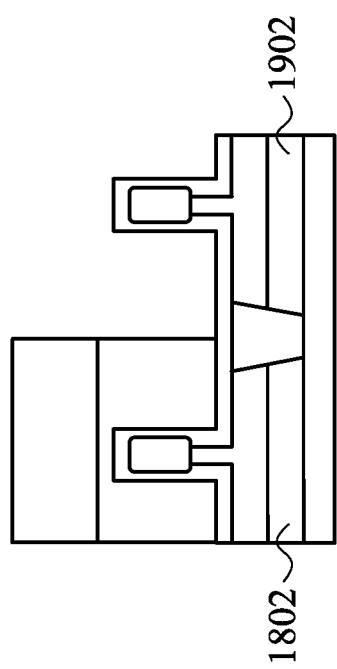
FIG. 20 is a sectional view illustrating the exemplary semiconductor device in accordance with some embodiments.

FIG. 20 is a sectional view illustrating the exemplary semiconductor device in accordance with some embodiments. As shown in FIG. 20, plasma ashing is performed removing the photoresist (not shown). The screening oxide is removed. Therefore, the p-well 1802 and n-well 1902 are formed under the first vertical structure 1402 and the second vertical structure 1404 respectively.

Figure 21:
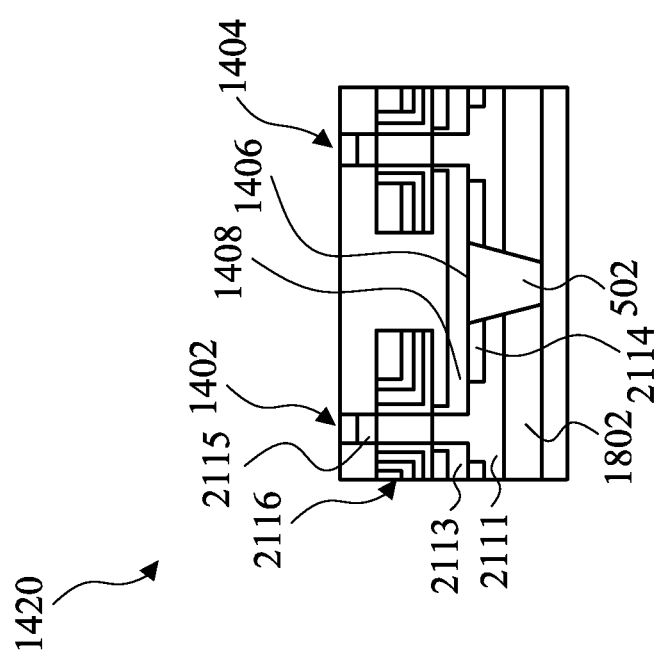
FIG. 21 is a sectional view illustrating the exemplary semiconductor device in accordance with some embodiments.

FIG. 21 is a sectional view illustrating the exemplary semiconductor device in accordance with some embodiments. As shown in FIG. 21, the first vertical structure 1402 includes a source 2111, a drain 2115, and a channel 2114 which may be formed in the initial phase in FIG. 1 or in the latter phase starting from FIG. 14. Silicide 2112 is formed over the source 2111. A silicon nitride layer 2113 surrounds the source 2111. A channel 2114 is disposed over the source 2111. A drain 2115 is disposed over the channel 2114. A gate 2116 surrounding the channel 2114 includes a high-K dielectrics, work function metal layers, and metal material.

The method incorporated with formation of the STI 502 provides substantial alignment (or a divot which would be merely a tiny step height between the surface 1408 of the source 2111 of the vertical structure 1402 and the top 1406 of the shallow trench isolation 502), so as to enhance process control on a gate length of the vertical structures 1402 in latter processes.

Figure 22:
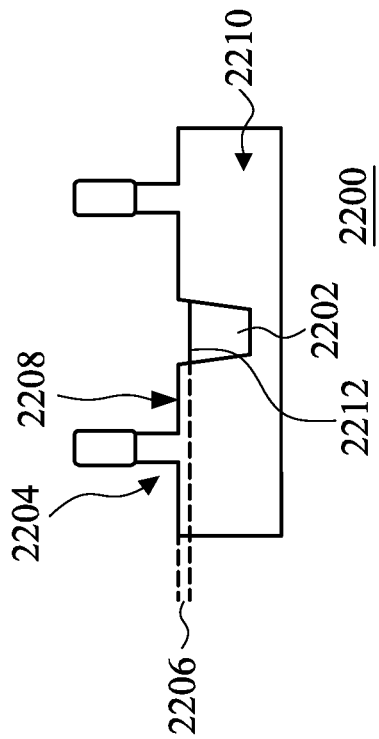
FIG. 22 is a sectional view illustrating a semiconductor device having a divot.

FIG. 22 is a sectional view illustrating a semiconductor device having a divot or step height. As shown in FIG. 22, a semiconductor device 2200 is provided. The semiconductor device 2200 has a vertical device 2204, a substrate 2210, and an STI 2202. The vertical device 2204 protrudes from the substrate 2210. The STI 2202 is embedded in the substrate 2210. Compared to the semiconductor device in FIG. 14 using the method in the disclosure, the surface 2208 of the substrate 2210 is not aligned with the surface 2212 of the STI 2202.

In the embodiment, the vertical device 2204 may not include a source, a channel and a drain which may be formed thereafter. The semiconductor device 2200 produces misalignment (a large divot or step height between the surface 2208 of the substrate 2210 and the surface 2212 of the STI 2202), so as to change a gate length of the vertical structures 2204 from its predetermined value in latter processes. In some embodiments, the divot or step height is about 20 to about 100 angstroms.

In some embodiments, the vertical structure 2204 may include a source, a channel and a drain already, wherein the surface 2208 is included in the source (not shown). The semiconductor device 2200 produces misalignment (a large divot between the surface 2208 of the source of the vertical structure 2204 and the surface 2212 of the STI 2202), so as to change a gate length of the vertical structures 2204 from its predetermined value in latter processes.

Figure 23:
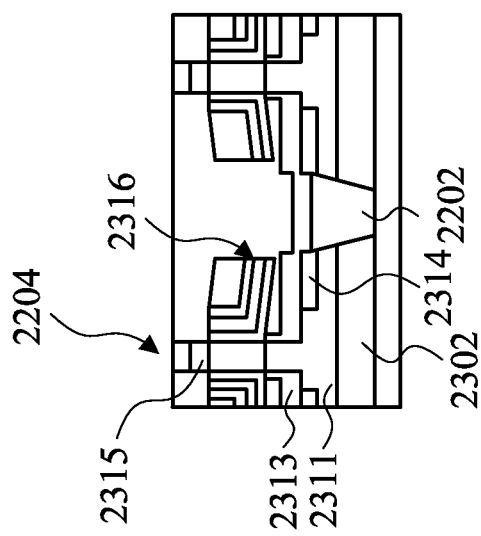
FIG. 23 is a sectional view illustrating the semiconductor device having undesired gate length resulting from the divot.

FIG. 23 is a sectional view illustrating the semiconductor device having undesired gate length resulting from the divot or step height. As shown in FIG. 23, continuing from FIG. 22, a plurality of processes are performed on the semiconductor device 2200. The first vertical structure 2204 includes a source 2311, a drain 2315, a gate 2316, and a channel 2314. Silicide 2312 is formed over the source 2311. A silicon nitride layer 2313 surrounds the source 2311. A channel 2314 is disposed over the source 2311. A drain 2315 is disposed over the channel 2314. A gate 2316 surrounding the channel 2314 includes a high-K dielectrics, work function metal layers, and metal material. However, compared to the exemplary semiconductor device in accordance with some embodiments in FIG. 21, due to undesired shape change of the gate 2316 resulting from the divot or misalignment when the enclosure of vertical structure is small, the gate length of the gate 2316 is changed from its predetermined value and does not meet expected device characteristics, such as threshold voltage or saturation current.

Figure 24:
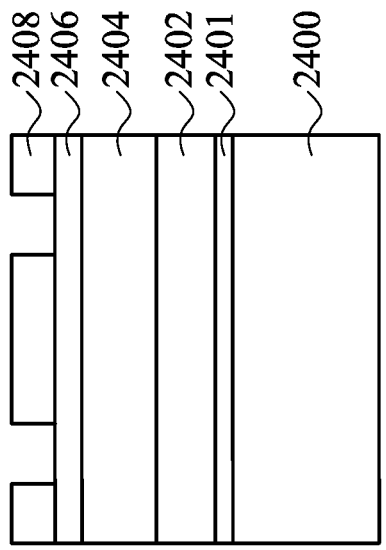
FIG. 24 is a sectional view illustrating an exemplary semiconductor device in accordance with some embodiments.

FIG. 24 is a sectional view illustrating an exemplary semiconductor device in accordance with some embodiments. As shown in FIG. 24, a substrate 2400 is provided. A first oxide layer 2401 is formed over the substrate 2400. A first dummy layer 2402 is formed over the first oxide layer 2401. Then, another planarization layer 2404 is also formed over the first dummy layer 2402. Another silicon anti-reflection coating layer 2406 and another photoresist layer 2408 are used for an etching process. The first dummy layer 2402 may be made of: dielectric material, such as silicon oxide or silicon nitride; and conductive material, such as amorphous silicon or poly.

Figure 25:
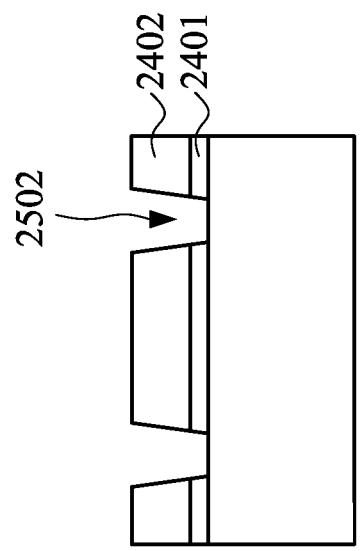
FIG. 25 is a sectional view illustrating the exemplary semiconductor device in accordance with some embodiments.

FIG. 25 is a sectional view illustrating an exemplary semiconductor device in accordance with some embodiments. As shown in FIG. 25, the first oxide layer 2401, the first dummy layer 2402, the planarization layer 2404, the silicon anti-reflection coating layer 2406 and the photoresist layer 2408 are etched, and the planarization layer 2404, the silicon anti-reflection coating layer 2406 and the photoresist layer 2408 are further removed, for example, by using plasma etching and wet etching to form a first recess 2502.

Figure 26:
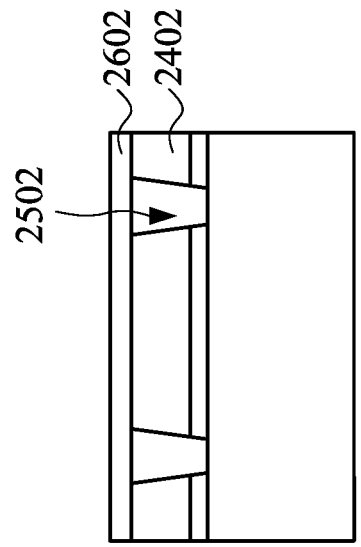
FIG. 26 is a sectional view illustrating the exemplary semiconductor device in accordance with some embodiments.

FIG. 26 is a sectional view illustrating the exemplary semiconductor device in accordance with some embodiments. As shown in FIG. 26, a second dummy layer 2602 is formed over the first dummy layer 2402 and in the first recess 2502 by a deposition process. The second dummy layer 2602 may be made of SiOCN. The second dummy layer 2602 has high etch selectivity toward the first dummy layer 2402.

Figure 27:
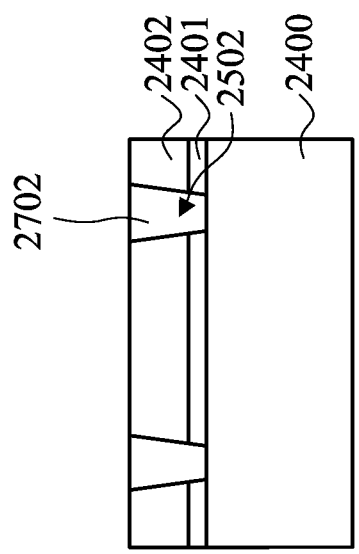
FIG. 27 is a sectional view illustrating the exemplary semiconductor device in accordance with some embodiments.

FIG. 27 is a sectional view illustrating the exemplary semiconductor device in accordance with some embodiments. As shown in FIG. 27, a CMP process is performed on the second dummy layer 2602 and stops at the first dummy layer 2402. A first hard mask 2702 is formed in the first recess 2502.

Figure 28:
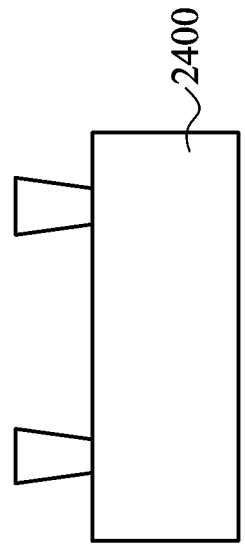
FIG. 28 is a sectional view illustrating the exemplary semiconductor device in accordance with some embodiments.

FIG. 28 is a sectional view illustrating the exemplary semiconductor device in accordance with some embodiments. As shown in FIGS. 27 and 28, the first dummy layer 2402 is removed by using plasma etching or wet etching. Then, the first oxide layer 2401 is removed to expose the substrate 2400.

Figure 29:
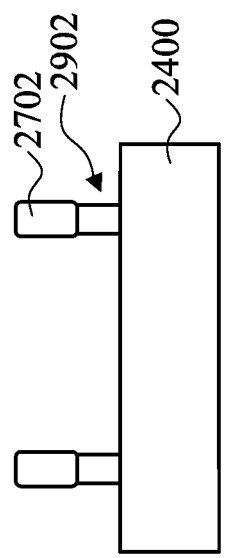
FIG. 29 is a sectional view illustrating the exemplary semiconductor device in accordance with some embodiments.

FIG. 29 is a sectional view illustrating the exemplary semiconductor device in accordance with some embodiments. As shown in FIG. 29, the first hard mask 2702 is trimmed. The substrate 2400 is etched back to form a first vertical structure 2902. FIGS. 24-29 demonstrate a method for forming the vertical structure 2902. Compared to general lithography, the method provides a precise control over critical dimension of the vertical structures.

Figure 30:
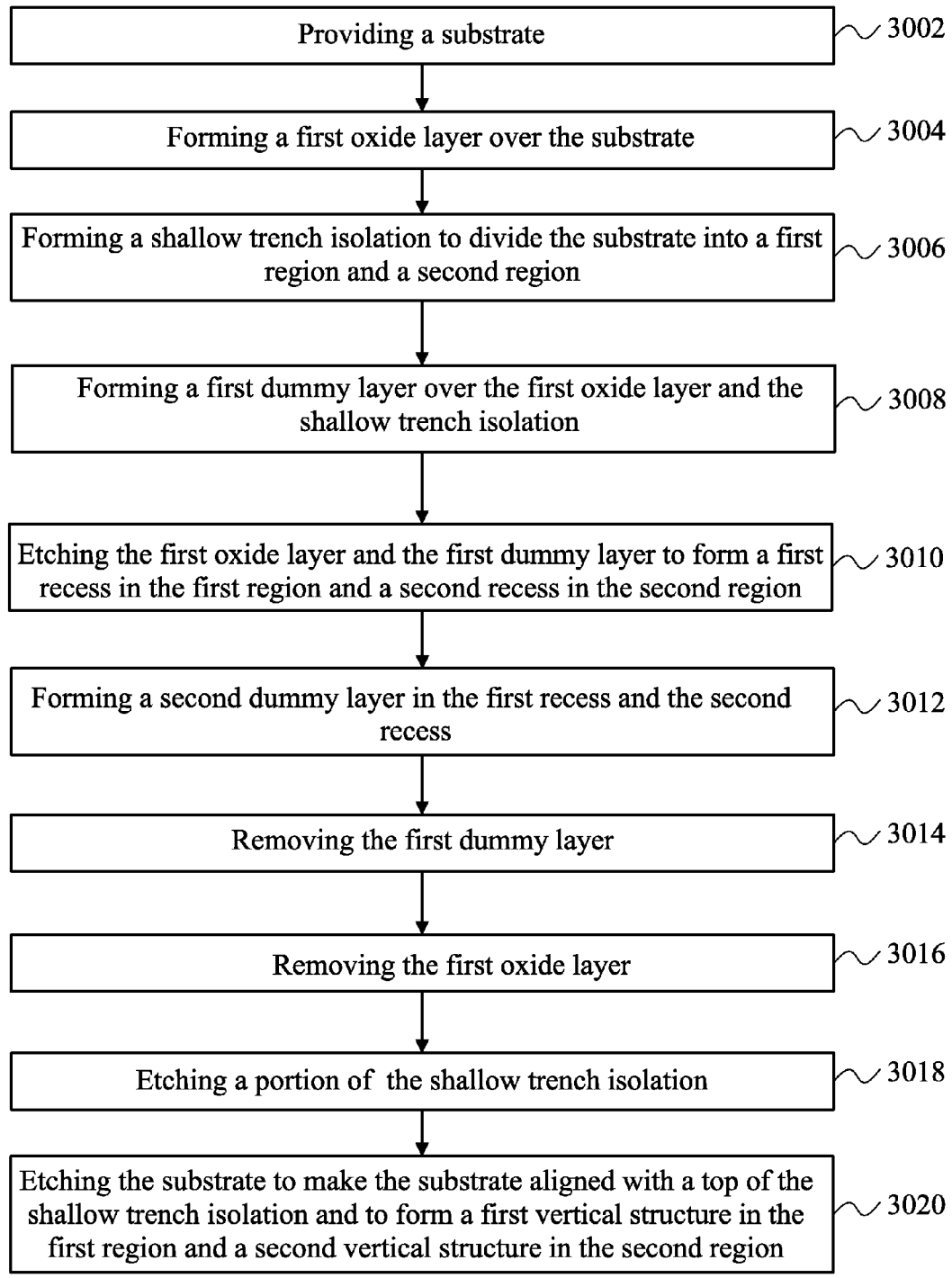
FIG. 30 is a flow chart for a method forming a vertical structure in accordance with some embodiments.

FIG. 30 is a flow chart for a method forming a vertical structure in accordance with some embodiments. As shown in FIG. 30, a method 3000 is provided. The method 3000 includes the following operations: providing a substrate (3002); forming a first oxide layer over the substrate (3004); forming a shallow trench isolation to divide the substrate into a first region and a second region (3006); forming a first dummy layer over the first oxide layer and the shallow trench isolation (3008); etching the first oxide layer and the first dummy layer to form a first recess in the first region and a second recess in the second region (3010); forming a second dummy layer in the first recess and the second recess (and further performing CMP on the second dummy layer and stop on the first dummy layer) (3012); removing the first dummy layer (3014); removing the first oxide layer (3016); etching a portion of the shallow trench isolation (3018); and etching the substrate to make the substrate aligned with a top of the shallow trench isolation and to form a first vertical structure in the first region and a second vertical structure in the second region (3020).

The operation 3004 may further include forming the first oxide layer made of silicon oxide over the substrate. The operation 3008 may further include forming the first dummy layer made of conductive material over the first oxide layer and the shallow trench isolation. The operation 3008 may further include forming the first dummy layer made of dielectric material over the first oxide layer and the shallow trench isolation. The operation 3012 may further include forming the second dummy layer of high etch selectivity toward the first dummy layer. The operation 3012 may further include forming the second dummy layer made of SiOCN in the first recess and the second recess. The operation 3020 may further include etching the substrate to make a divot between the top of the shallow trench isolation and the substrate lower than about 20-100 angstroms. The method 3000 may further include performing chemical mechanical polishing on the second dummy layer and stopping at the first dummy layer.

The method 3000 may further include one or more of the following processes: performing hydrogen annealing on the first vertical structure, the second vertical structure, and the substrate; performing an in-situ steam generation process on the first vertical structure, the second vertical structure, and the substrate to form a third oxide layer; performing STI densification annealing on the shallow trench isolation; etching the third oxide layer while maintain the shallow trench isolation; forming a screen oxide on the first vertical structure, the second vertical structure, and the substrate; ion implanting a first dopant into the first region of the substrate through the screen oxide; ion implanting a second dopant into the second region of the substrate through the screen oxide; and removing the screen oxide.

The operation 3006 may further include one or more of the following processes: forming a stop layer over the first oxide layer; forming a second oxide layer over the stop layer; forming a planarization layer over the second oxide layer; etching the first oxide layer, the stop layer, the second oxide layer, and the planarization layer to expose a portion of the substrate; removing the planarization layer; removing the second oxide layer; etching the exposed portion of the substrate to form a trench; forming a third oxide layer in the trench; polishing the third oxide layer and stopping at the stop layer; and removing the stop layer.

Figure 31:
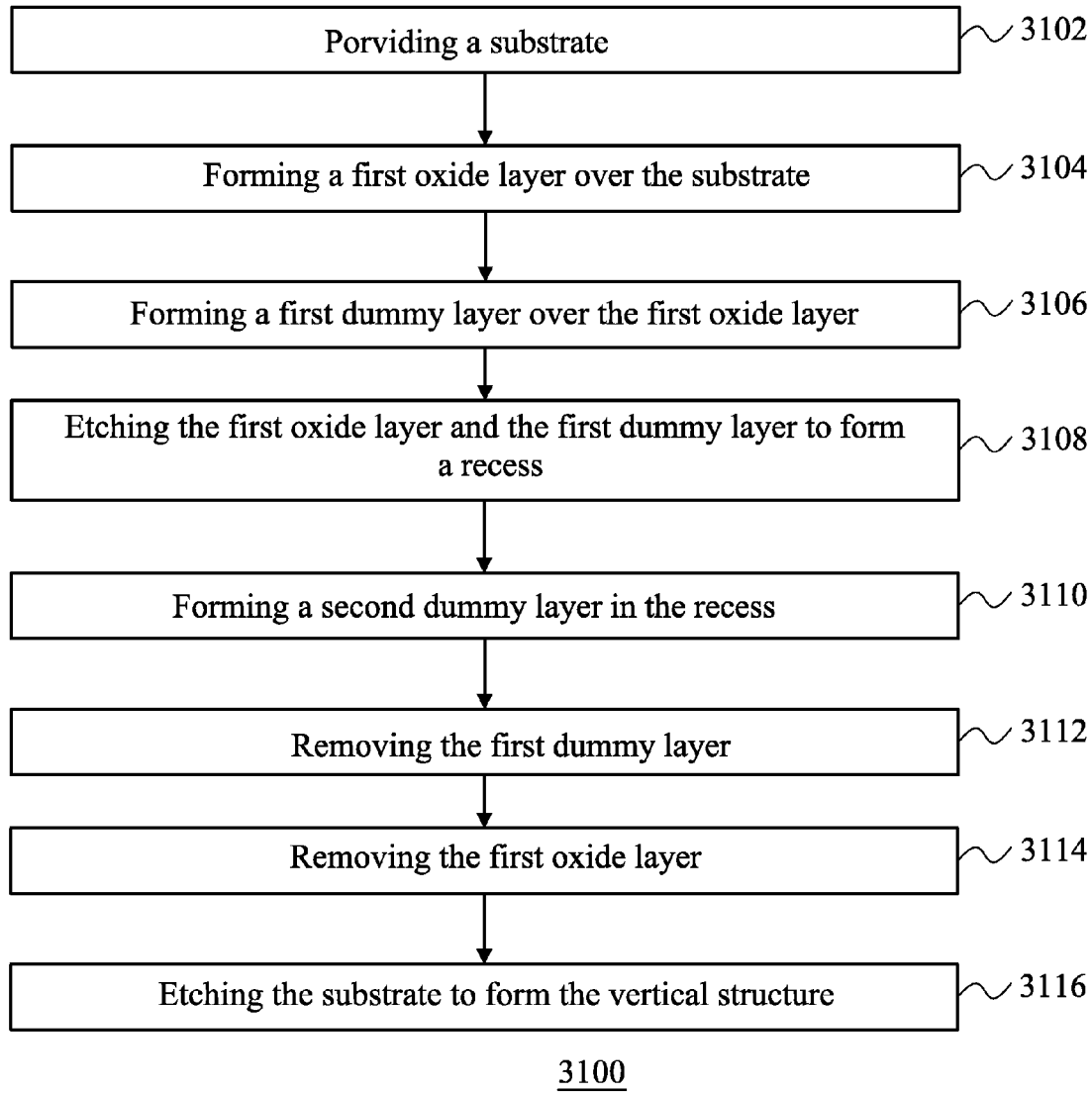
FIG. 31 is a flow chart for a method forming a vertical structure in accordance with some embodiments.

FIG. 31 is a flow chart for a method forming a vertical structure in accordance with some embodiments. As shown in FIG. 31, a method 3100 is provided. The method 3100 includes the following operations: providing a substrate (3102); forming a first oxide layer over the substrate (3104); forming a first dummy layer over the first oxide layer (3106); etching the first oxide layer and the first dummy layer to form a recess (3108); forming a second dummy layer in the recess (and further performing CMP on the second dummy layer and stop on the first dummy layer) (3110); removing the first dummy layer (3112); removing the first oxide layer (3114); and etching the substrate to form the vertical structure (3116).

The operation 3104 may further include forming the first oxide layer made of silicon oxide over the substrate. The operation 3106 may further include forming the first dummy layer made of conductive material over the first oxide layer. The operation 3106 may further include forming the first dummy layer made of dielectric material over the first oxide layer. The operation 3110 may further include forming the second dummy layer of high etch selectivity toward the first dummy layer. The operation 3110 may further include forming the second dummy layer made of SiOCN in the recess. The method 3100 may further include performing chemical mechanical polishing on the second dummy layer and stopping at the first dummy layer.

According to an exemplary embodiment, a method of forming vertical structures is provided. The method includes the following operations: providing a substrate; forming a first oxide layer over the substrate; forming a shallow trench isolation to divide the substrate into a first region and a second region; forming a first dummy layer over the first oxide layer and the shallow trench isolation; etching the first oxide layer and the first dummy layer to form a first recess in the first region and a second recess in the second region; forming a second dummy layer in the first recess and the second recess; removing the first dummy layer; removing the first oxide layer; etching a portion of the shallow trench isolation; and etching the substrate to make the substrate aligned with a top of the shallow trench isolation and to form a first vertical structure in the first region and a second vertical structure in the second region.

According to an exemplary embodiment, a method of forming vertical structures is provided. The method includes the following operations: providing a substrate; forming a first oxide layer over the substrate; forming a first dummy layer over the first oxide layer; etching the first oxide layer and the first dummy layer to form a recess; forming a second dummy layer in the recess (and further performing CMP on the second dummy layer and stop on the first dummy layer); removing the first dummy layer; removing the first oxide layer; and etching the substrate to form the vertical structure.

According to an exemplary embodiment, a semiconductor device is provided. The semiconductor device includes: a substrate; an STI embedded in the substrate; and a vertical transistor having a source substantially aligned with the STI.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming vertical structures, comprising:
   providing a substrate;
   forming a first oxide layer over the substrate;
   forming a shallow trench isolation to divide the substrate into a first region and a second region;
   forming a first dummy layer over the first oxide layer and the shallow trench isolation;
   etching the first oxide layer and the first dummy layer to form a first recess in the first region and a second recess in the second region;
   forming a second dummy layer in the first recess and the second recess;
   removing the first dummy layer;
   removing the first oxide layer;
   etching a portion of the shallow trench isolation; and
   etching the substrate to make the substrate aligned with a top of the shallow trench isolation and to form a first vertical structure in the first region and a second vertical structure in the second region.

2. The method of claim 1, wherein forming the first oxide layer over the substrate further comprises forming the first oxide layer made of silicon oxide over the substrate.

3. The method of claim 1, wherein forming the first dummy layer over the first oxide layer and the shallow trench isolation further comprises forming the first dummy layer made of conductive material over the first oxide layer and the shallow trench isolation.

4. The method of claim 1, wherein forming the first dummy layer over the first oxide layer and the shallow trench isolation further comprises forming the first dummy layer made of dielectric material over the first oxide layer and the shallow trench isolation.

5. The method of claim 1, wherein forming the second dummy layer in the first recess and the second recess further comprises forming the second dummy layer of high etch selectivity toward the first dummy layer.

6. The method of claim 1, wherein forming the second dummy layer in the first recess and the second recess further comprises forming the second dummy layer made of SiOCN in the first recess and the second recess.

7. The method of claim 1, wherein etching the substrate to make the substrate aligned with the top of the shallow trench isolation and to form the first vertical structure in the first region and the second vertical structure in the second region further comprises etching the substrate to make a divot between the top of the shallow trench isolation and the substrate lower than 20-100 angstroms.

8. The method of claim 1, further comprising performing chemical mechanical polishing on the second dummy layer and stopping at the first dummy layer.

9. The method of claim 1, further comprising:
   performing hydrogen annealing on the first vertical structure, the second vertical structure, and the substrate;
   performing an in-situ steam generation process on the first vertical structure, the second vertical structure, and the substrate to form a third oxide layer;
   performing STI densification annealing on the shallow trench isolation;
   etching the third oxide layer while maintain the shallow trench isolation;
   forming a screen oxide on the first vertical structure, the second vertical structure, and the substrate;
   ion implanting a first dopant into the first region of the substrate through the screen oxide;
   ion implanting a second dopant into the second region of the substrate through the screen oxide; and
   removing the screen oxide.

10. The method of claim 1, wherein forming the shallow trench isolation to divide the substrate into the first region and the second region further comprises:
    forming a stop layer over the first oxide layer;
    forming a second oxide layer over the stop layer;
    forming a planarization layer over the second oxide layer;

etching the first oxide layer, the stop layer, the second oxide layer, and the planarization layer to expose a portion of the substrate;
removing the planarization layer;
removing the second oxide layer;
etching the exposed portion of the substrate to form a trench;
forming a third oxide layer in the trench;
polishing the third oxide layer and stopping at the stop layer; and
removing the stop layer.

11. A method of forming a vertical structure, comprising:
providing a substrate;
forming a first oxide layer over the substrate;
forming a first dummy layer over the first oxide layer;
etching the first oxide layer and the first dummy layer to form a recess;
forming a second dummy layer in the recess;
removing the first dummy layer;
removing the first oxide layer; and
etching the substrate to form the vertical structure.

12. The method of claim 11, wherein forming the first oxide layer over the substrate further comprises forming the first oxide layer made of silicon oxide over the substrate.

13. The method of claim 11, wherein forming the first dummy layer over the first oxide layer further comprises forming the first dummy layer made of conductive material over the first oxide layer.

14. The method of claim 11, wherein forming the first dummy layer over the first oxide layer further comprises forming the first dummy layer made of dielectric material over the first oxide layer.

15. The method of claim 11, wherein forming the second dummy layer in the recess further comprises forming the second dummy layer of high etch selectivity toward the first dummy layer.

16. The method of claim 11, wherein forming the second dummy layer in the recess further comprises forming the second dummy layer made of SiOCN in the recess.

17. The method of claim 11, further comprising: performing chemical mechanical polishing on the second dummy layer and stopping at the first dummy layer.

* * * * *